(12) United States Patent
Kawada et al.

(10) Patent No.: US 10,665,424 B2
(45) Date of Patent: May 26, 2020

(54) PATTERN MEASURING METHOD AND PATTERN MEASURING APPARATUS

(71) Applicant: Hitachi High-Technologies Corporation, Minato-ku, Tokyo (JP)

(72) Inventors: Hiroki Kawada, Tokyo (JP); Takahiro Kawasaki, Tokyo (JP); Junichi Kakuta, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/046,461

(22) Filed: Jul. 26, 2018

(65) Prior Publication Data

US 2019/0066973 A1 Feb. 28, 2019

(30) Foreign Application Priority Data

Aug. 29, 2017 (JP) .................................. 2017-163971

(51) Int. Cl.
*H01J 37/28* (2006.01)
*H01L 21/67* (2006.01)
(Continued)

(52) U.S. Cl.
CPC ............ *H01J 37/28* (2013.01); *G03F 7/7065* (2013.01); *G03F 7/70616* (2013.01); *G06T 7/0004* (2013.01); *G06T 7/13* (2017.01); *H01L 21/67288* (2013.01); *H01L 22/12* (2013.01); *G06T 2207/10061* (2013.01); *G06T 2207/30148* (2013.01); *H01J 2237/223* (2013.01); *H01J 2237/24578* (2013.01); *H01J 2237/2817* (2013.01)

(58) Field of Classification Search
CPC ... H01J 37/28; H01J 2237/2817; H01L 22/12; H01L 21/67288
USPC ................................ 250/306, 307, 310, 311
See application file for complete search history.

(56) References Cited

U.S. PATENT DOCUMENTS 7,095,884 B2* 8/2006 Yamaguchi ...... G01N 21/95684
                                                    250/559.36
7,619,751 B2* 11/2009 Yamaguchi ........ G01N 23/2251
                                                    250/300
(Continued)

FOREIGN PATENT DOCUMENTS

JP            3870044 B2    1/2007

*Primary Examiner* — Michael Maskell
(74) *Attorney, Agent, or Firm* — Crowell & Moring LLP

(57) ABSTRACT

A pattern measuring method and a pattern measuring apparatus that efficiently prevent a measurement error inherent to a device that performs beam scanning in a specific direction such as a scanning electron microscope are provided. The invention is directed to a pattern measuring method and a pattern measuring apparatus in which a first curve with respect to an edge of one side and a second curve with respect to an edge of the other side are obtained by calculating a first power spectral density with respect to the edge of one side of a pattern and a second power spectral density with respect to the edge of the other side of the pattern based upon a signal that is obtained when a charged particle beam is scanned in a direction intersecting the edge of the pattern; a difference value between the first curve and the second curve is calculated; and one of the first curve and the second curve is corrected by using the difference value.

8 Claims, 8 Drawing Sheets

(51) Int. Cl.
*H01L 21/66* (2006.01)
*G06T 7/00* (2017.01)
*G03F 7/20* (2006.01)
*G06T 7/13* (2017.01)

(56) References Cited

U.S. PATENT DOCUMENTS

| | | | |
|---|---|---|---|
| 8,742,345 B1* | 6/2014 | Cai | H01J 37/263 |
| | | | 250/307 |
| 9,658,063 B2* | 5/2017 | Yamaguchi | H01J 37/222 |
| 2014/0264016 A1* | 9/2014 | Chen | H01J 37/26 |
| | | | 250/307 |
| 2016/0035538 A1* | 2/2016 | Fukuda | H01J 37/285 |
| | | | 250/307 |

* cited by examiner

[FIG. 1]
EXAMPLE OF SCAN SIGNAL OF LINE PATTERN
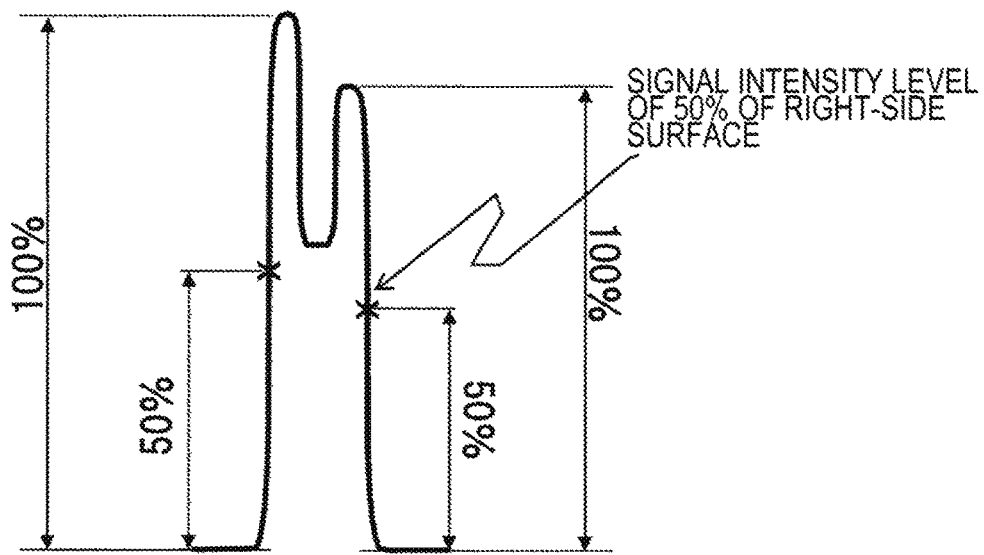
[FIG. 2]
PSD OF LER OF RIGHT EDGE
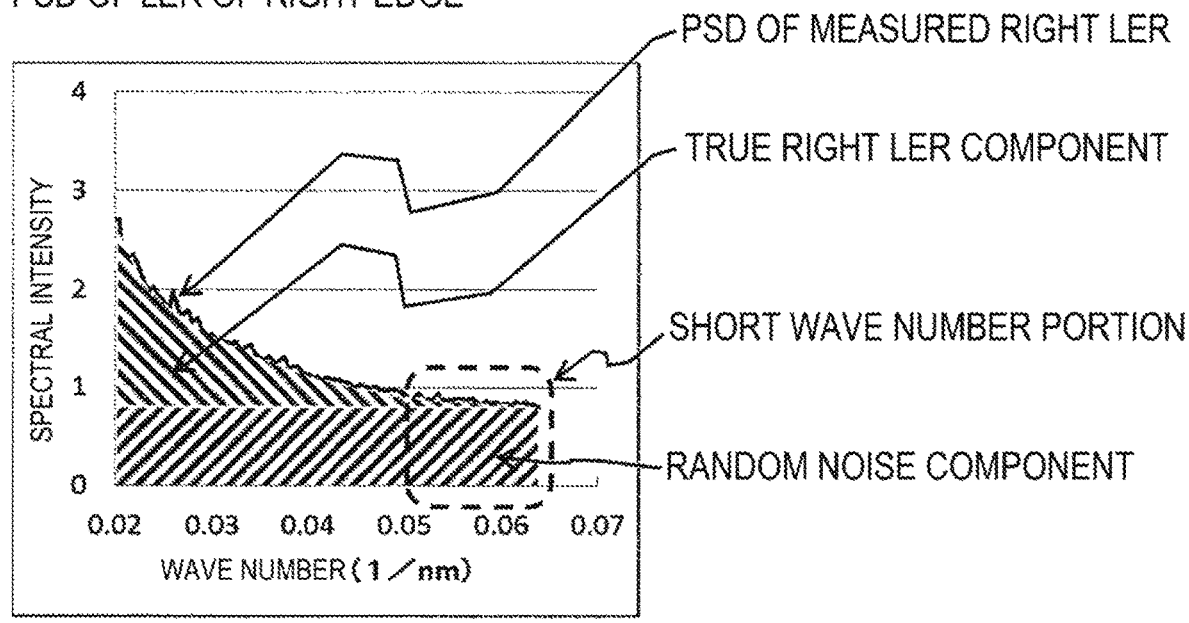

[FIG. 3]
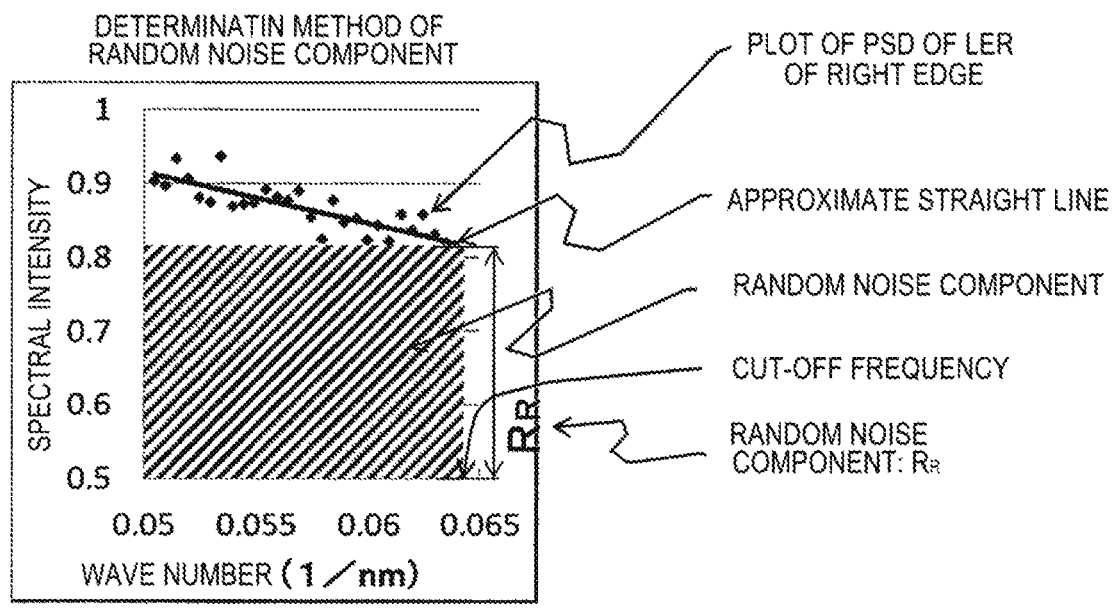

[FIG. 4]
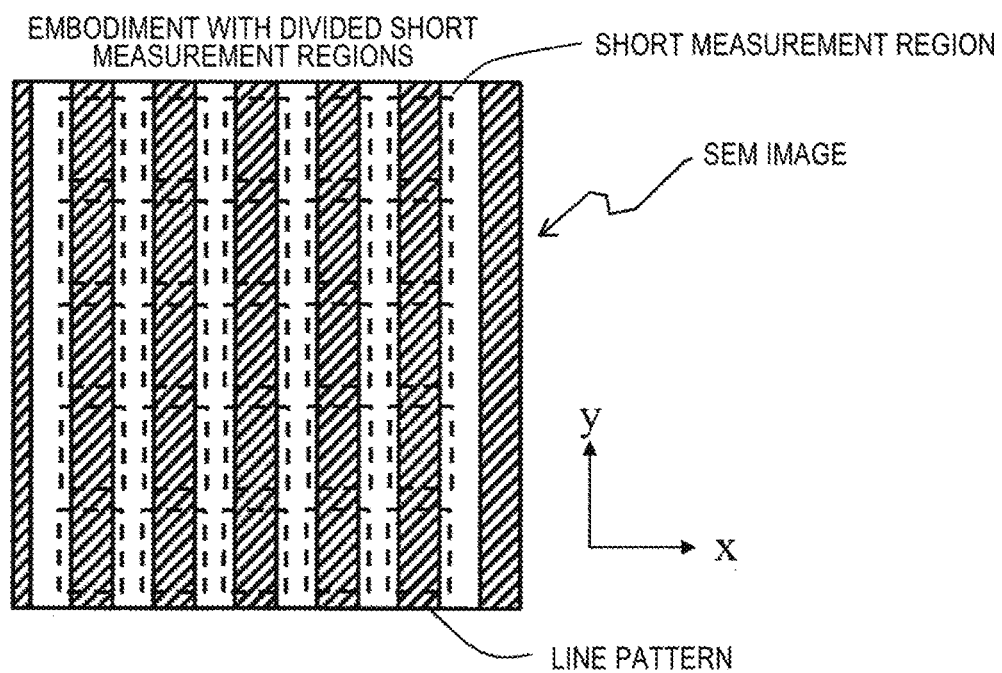

[FIG. 5]
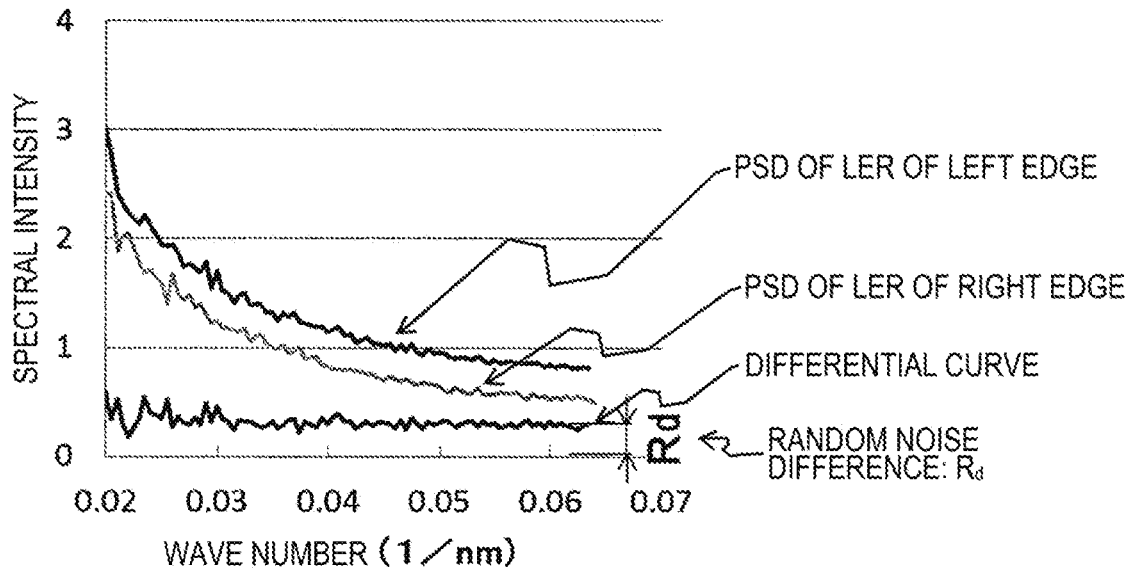
[FIG. 6]
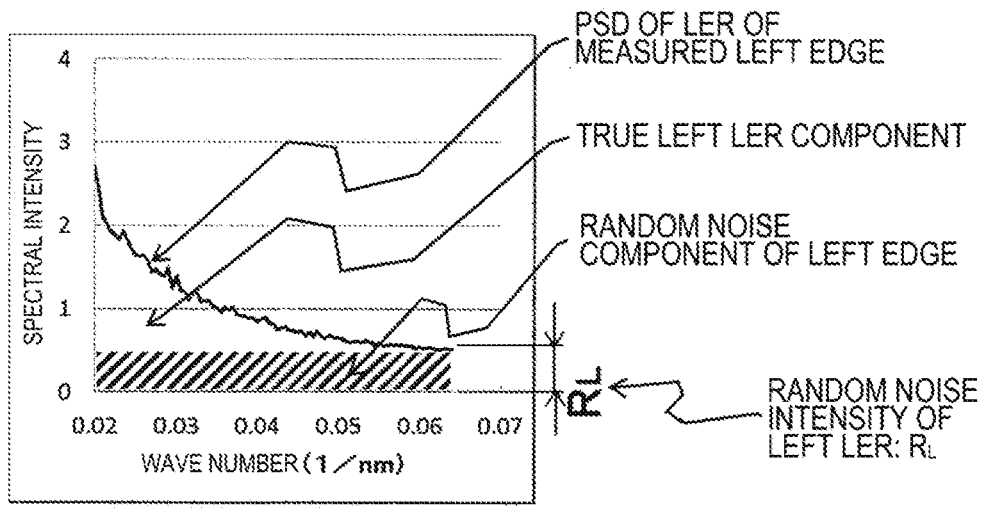

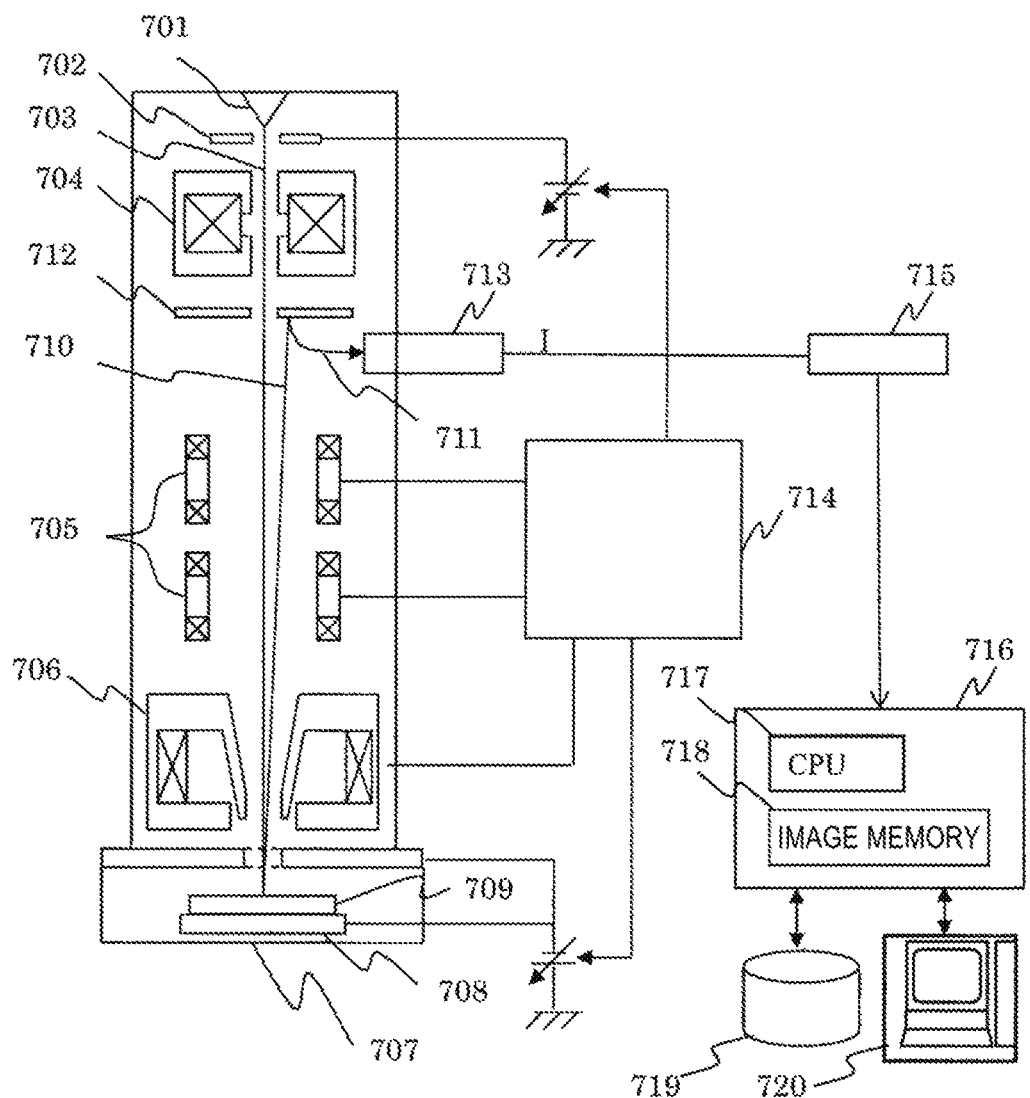
[FIG. 7]

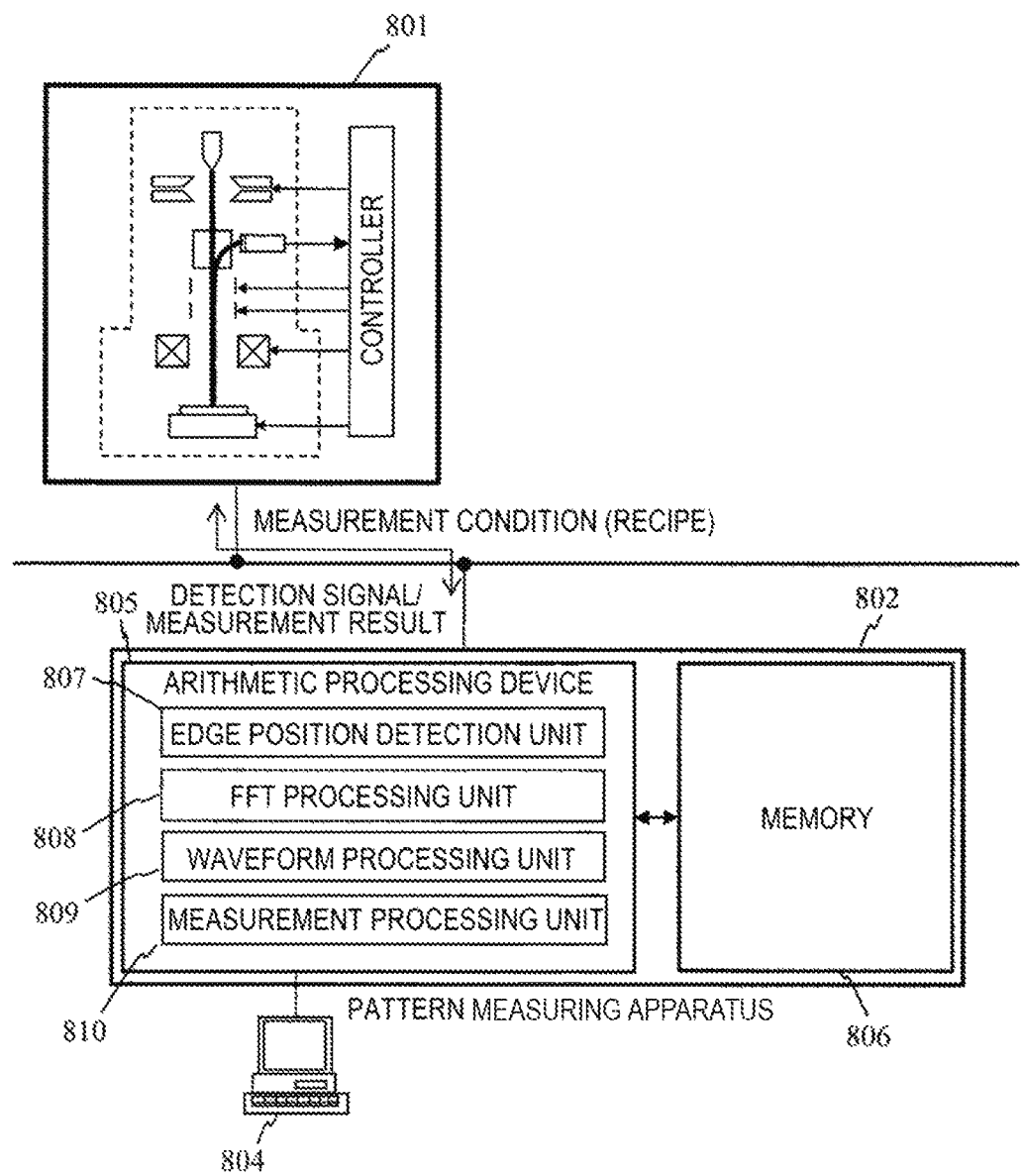

[FIG. 9]
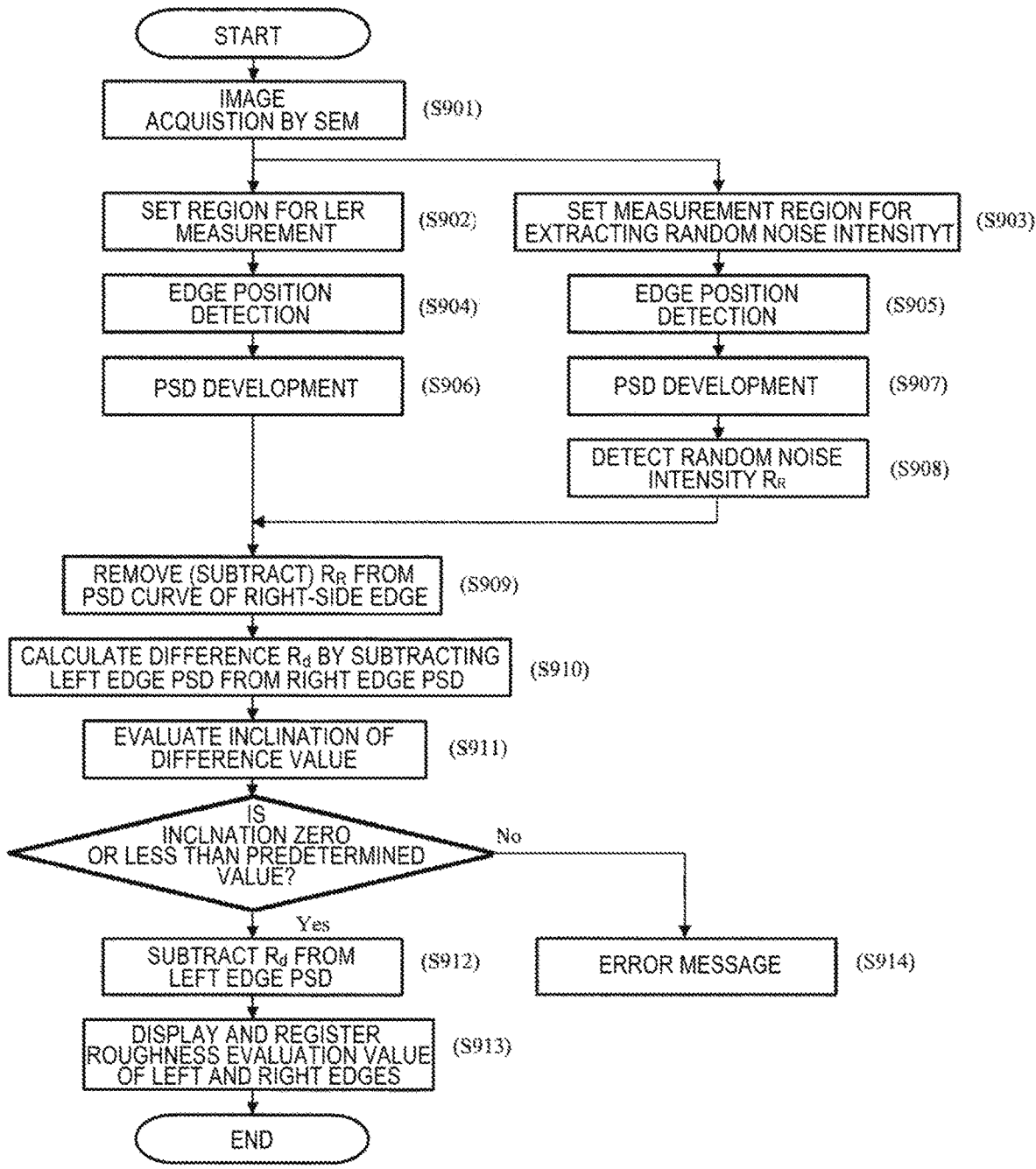

[FIG. 10]
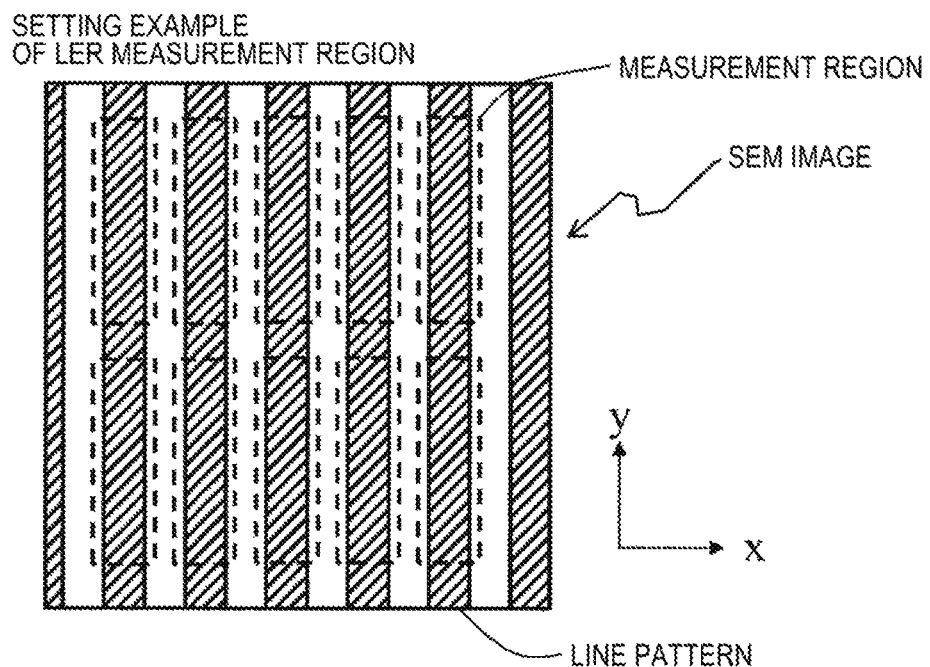

PATTERN MEASURING METHOD AND PATTERN MEASURING APPARATUS

TECHNICAL FIELD

The present disclosure relates to a pattern measuring method and a pattern measuring apparatus, and more particularly, to a pattern measuring method and a pattern measuring apparatus for accurately measuring roughness occurring at an edge of a pattern which is an object to be measured.

BACKGROUND ART

In an LSI process, particularly, in a microfabrication process after ArF lithography, edge roughness of a pattern (surface irregularity of a pattern end part) has a great influence on yield of a device as the pattern is refined. An occurrence degree of the roughness largely varies depending on a material constituting a semiconductor device, an exposure device, or properties and characteristics of a ground substrate, and the like. Particularly, in a mass production process, a size of the roughness has a great influence on performance of a product. Further, even though the roughness is not abnormally large, an appearance of characteristic roughness often reflects performance deterioration of a manufacturing device, such that there exists a possibility that the performance deterioration thereof may cause a product defect in the future. Accordingly, it is urgent to develop a system not only capable of observing a roughness shape of a pattern edge, but also capable of identifying an occurrence cause from characteristics thereof. Further, in consideration of the use in the mass production process, an inspection method is required to be non-destructive inspection.

As a background art in this technical field, PTL 1 discloses a measuring method of obtaining edge roughness of respective left and right sides of a line pattern as a 3σ value indicating a width of surface irregularity fluctuation based upon an ideal straight line. Further, in PTL 1, proposed herein is a method of analyzing an edge shape by performing Fourier analysis on a set of fluctuation data and obtaining intensity with respect to a spatial frequency.

CITATION LIST

Patent Literature

PTL 1: Japanese patent No. 3870044 (corresponding U.S. Pat. No. 7,095,884)

SUMMARY OF INVENTION

Technical Problem

Meanwhile, according to examinations by inventors, it has been clear that there exists a possibility that a measurement error occurs due to characteristics of a measuring apparatus used for highly and accurately evaluating roughness. Specifically, it has been clearly found out that there exists a possibility of generating a measurement error inherent to a charged particle beam device that repeats beam scanning in a specific direction such as a scanning electron microscope (SEM). Meanwhile, PTL 1 does not disclose any methods, and the like for effectively preventing the above-mentioned error.

Hereinafter, the present disclosure has been made in an effort to provide a pattern measuring method and a pattern measuring apparatus capable of efficiently preventing a measurement error inherent to a device that performs beam scanning in a specific direction such as a scanning electron microscope.

Solution to Problem

As one aspect for achieving the above-mentioned object, proposed herein is a pattern measuring method and a pattern measuring apparatus in which a first curve with respect to an edge of one side and a second curve with respect to an edge of the other side are obtained by calculating a first power spectral density with respect to the edge of one side of a pattern and a second power spectral density with respect to the edge of the other side of the pattern based upon a signal that is obtained when scanning a charged particle beam in a direction intersecting the edge of the pattern; a difference value between the first curve and the second curve is calculated; and one of the first curve and the second curve is corrected by using the difference value.

Advantageous Effects of Invention

According to the configurations, it is advantageously possible not only to efficiently prevent a measurement error inherent to a device that performs beam scanning in a specific direction, but also to perform pattern measurement with high accuracy.

BRIEF DESCRIPTION OF DRAWINGS

FIG. 1 is a diagram illustrating an example of a signal waveform obtained by scanning a line pattern with an electron beam.

FIG. 2 is a diagram illustrating an example of a PSD curve of an LER obtained based upon a signal waveform detection of a right-side edge of the line pattern.

FIG. 3 is a diagram illustrating a random noise component included in a PSD curve.

FIG. 4 is a diagram illustrating an example of setting a measurement region for extracting a random noise component on an SEM image.

FIG. 5 is a diagram illustrating an example of a PSD curve of an LER at left and right edges.

FIG. 6 is a diagram illustrating an example of a PSD curve of an LER obtained based upon signal waveform detection of a left-side edge of a line pattern.

FIG. 7 is a diagram illustrating an example of a scanning electron microscope which is a type of charged particle beam device.

FIG. 8 is a diagram illustrating an example of a pattern measurement system including a pattern measuring apparatus which performs pattern measurement based upon a scanning electron microscope and an output of the scanning electron microscope.

FIG. 9 is a flowchart illustrating a measurement process of a roughness evaluation value.

FIG. 10 is a diagram illustrating an example of setting a measurement region for calculating a roughness evaluation value on an SEM image.

DESCRIPTION OF EMBODIMENTS

In recent years, Extreme Ultra-Violet (EUV) light has been used as a light source of an exposure device used for photolithography for forming a pattern of a semiconductor device, thereby having an effect of manufacturing a finer pattern. When an electron beam is scanned on a pattern formed by the exposure device having an EUV light source, and edge roughness of the pattern is measured and analyzed based upon a signal obtained by the scanning, roughness of a left-side edge (edge of one side) of the pattern and roughness of a right-side edge (edge of the other side) thereof are different from each other, such that a magnitude relationship therebetween occurs. According to a result of keen examinations of inventors, when the electron beam is scanned in a direction intersecting a pattern edge, it has been clearly found out that the magnitude relationship occurs when the electron beam passes through the edge of one side and then the electron beam is scanned to draw a scanning light trajectory passing through the edge of the other side. More specifically, in a case where a plurality of long line patterns in a lateral direction (left and right directions) are arrayed in a vertical direction (up and down directions) of a scanning region within the scanning region (visual field) of the electron beam, when the beam is scanned from a left side of the scanning region to a right side thereof, the roughness of the right edge of each line becomes larger than that of the left edge. Even in the case of measurement using an SEM image photographed by rotating a scanning direction of the electron beam by 180° (scan the electron beam to pass through the edge of one side after the electron beam passes the edge of the other side) at the same visual field position, the roughness of the left edge becomes large.

In other words, the aforementioned phenomenon does not indicate that there exists a difference between the left and right sides in the roughness of photographed line patterns, but indicates that there exist some causes in the measurement by using the electron beam. Since the phenomenon is an error occurring by the measurement, the error is a factor to be prevented in measurement requiring sub-nanometer precision in recent years. Further, when measuring waviness of the line pattern itself (curvature of an edge at a relatively low frequency with respect to the roughness, that is, wiggling), it is required to measure the roughness, however, this error also becomes a factor causing deterioration of measurement accuracy.

As described above, the inventors newly not only find the cause of occurrence leading to the difference between the left side and right side in roughness, but also propose a pattern measuring method and a pattern measuring apparatus for performing roughness measurement with high accuracy regardless of the difference between the left side and right side.

The above-mentioned phenomenon is caused by the difference in an S/N ratio between the left and right sides of the line pattern which is an object to be measured, which will be described by using a signal waveform shown in FIG. 1. FIG. 1 is a diagram illustrating an example of a signal waveform obtained when an electron beam is scanned on a sample in which a plurality of vertically long line patterns are arrayed in a lateral direction. The signal waveform shown in FIG. 1 is obtained when scanning the electron beam in such a manner that an irradiation position of the beam is moved from a left direction to a right direction. The beam scanning forms a scanning line in which the irradiation position of the beam is moved from an x-direction negative side (left side) toward an x-direction positive side (right side) as a direction (x-direction) orthogonal to an edge of the line pattern, and the beam scanning is performed in such a manner that a ground irradiation position is deflected to move the scanning line sequentially in a y-direction. Two-dimensional scanning is executed based upon the above-mentioned scanning method.

In a case where the scanning line in the x-direction is formed, when scanning is performed from the left side to the right side, a secondary electron emitted from a sample tends to be larger than that generated from a right-side surface due to the irradiation of the electron beam to a left-side surface of the pattern.

A method referred to as a threshold method is used for measuring a line width of the pattern. As another method, there exists a linear method, however, as a result, two methods are the same each other, so the present disclosure will be described using the threshold method. A highest level is set as 100% and a lowest level is set as 0% among signals on the left-side surface. For example, a point of 50% level is set as an edge of the left-side surface. The same operation is also performed for signals on the right-side surface, thereby setting a point of 50 level as an edge of the right-side surface.

An actual signal not only includes a signal of a secondary electron coming out of the pattern, but also is overlapped with noise randomly generated in time from a detector of the secondary electron and electronic circuits such as an amplifier amplifying the signal, and the like. A position on the SEM image also appears at random. Accordingly, the actual signal appears almost equally and randomly on the left-side surface of the line pattern and the right-side surface thereof, respectively.

In the measurement of the roughness of the side surface, a position of an edge point of the side surface arranged along the vertical direction (up and down directions) of the line pattern is measured by measuring a width varying in the lateral direction (left and right directions). At this time, a variation width of the edge point tends to be wider than an actual point due to the influence of shot noise appearing at a random position. What is described above is referred to as bias in the roughness measurement, and the bias is an error factor that increases a measured value in appearance.

A bias amount on the roughness of the right-side surface tends to be larger than that of the left-side surface. The reason is that a signal intensity level of 50%, which is a reference for detecting the edge point of the right-side surface, is lower than that of the left-side surface, such that more shot noise is picked up. The 50% level of the respective left and right side surfaces is a ratio with respect to a 100% level thereof, however, as described just above, the 100% level of the right-side surface is originally lower than that of the left-side surface.

It has been known that when the bias amount is large, a measurement value of the roughness becomes larger in appearance, thereby causing an error factor. Since the bias amount is not true roughness but an error in measurement, it is desirable to individually and effectively reduce the bias amount in the respective edge roughness of the left and right sides.

According to exemplary embodiments described hereinafter, proposed herein is a pattern measuring method and a pattern measuring apparatus for removing an error factor caused by beam scanning depending on a type of an edge. Highly accurate measurement can be performed by being provided with the above-mentioned method, apparatus, and a computer program which executes the measuring method in an arithmetic processing device, and a storage medium which stores the computer program. Further, it is possible to improve production yield by accurately controlling manufacturing processing of a semiconductor device pattern.

In the exemplary embodiment described hereinafter, a charged particle beam device that is provided with the arithmetic processing device that measures the roughness with high accuracy will be described. Further, the charged particle beam device described hereinafter is controlled by a controller that is provided with a computer processor and a non-transitory computer readable medium. When the non-transitory computer readable medium is executed by the computer processor, the non-transitory computer readable medium is encoded by a computer instruction that allows a system controller to execute predetermined processing, and the charged particle beam device performed along processing steps to be described hereinbelow is controlled.

FIG. 7 is a diagram illustrating an example of a scanning electron microscope which executes the roughness measurement. An electron beam 703 is extracted from an electron source 701 by an extraction electrode 702, and the electron beam 703 is accelerated by an acceleration electrode (not shown). The accelerated electron beam 703 is focused by a condenser lens 704 which is one form of focusing lenses, and then deflected by a scanning deflector 705. Accordingly, the electron beam 703 is one-dimensionally or two-dimensionally scanned on a sample 709.

The electron beam 703 incident on the sample 709 is decelerated by a negative voltage applied to an electrode built in a sample stand 708, is focused by a lens action of an objective lens 706, and is irradiated on a surface of the sample 709. Electrons 610 (secondary electron, backscattered electrons, and the like) are emitted from an irradiated portion on the sample 709. An emitted electron 710 is accelerated in a direction of the electron source 701 by an acceleration action based upon the negative voltage that is applied to the electrode built in the sample stand 708. The accelerated electron 710 collides with a conversion electrode 712 and generates a secondary electron 711. The secondary electron 711 emitted from the conversion electrode 712 is captured by a detector 713, and an output I of the detector 713 changes according to an amount of the captured secondary electron. Luminance of a display device changes according to the change of the output I. For example, when forming a two-dimensional image, a deflection signal to the scanning deflector 705 and the output I of the detector 713 are synchronized with each other, thereby forming an image of a scanning region.

Further, the SEM illustrated in FIG. 7 shows an example of detecting the electron 710 emitted from the sample 709 by converting the electron 710 into the secondary electron 711 in the conversion electrode 712, however, the present invention is not limited to the above-mentioned configuration. For example, a configuration in which detection surfaces of an electron multiplying tube and a detector are arranged on a trajectory of the accelerated electron may be adopted. A controller 714 supplies necessary control signals to respective optical elements of the SEM according to an operation program for controlling the SEM which is referred to as an imaging recipe.

The signal detected by the detector 713 is converted into a digital signal by an A/D converter 715 and is transmitted to an image processing unit 716. The image processing unit 716 integrates signals obtained by a plurality of scans in a frame unit, thereby generating an integrated image. For example, in the case of integrating images of eight frames, the integrated image is generated by performing addition averaging processing on signals obtained by two-dimensional scanning of eight times in a pixel unit.

Further, the image processing unit 716 includes an image memory 718 which is an image storage medium for temporarily storing a digital image; and a CPU 717 which calculates a feature amount (a dimensional value of a width of a line or a hole, a roughness index value, an index value showing a pattern shape, an area value of a pattern, a pixel position becoming an edge position, and the like) from an image stored in the image memory 718.

Further, the image processing unit 716 includes a storage medium 719 that stores measured values of respective patterns, luminance values of respective pixels, and the like. Overall control is performed by a workstation 720, such that necessary operation of a device, confirmation of a detection result, and the like can be accomplished by a graphical user interface (hereinafter referred to as GUI). Further, the image memory 718 is configured to be synchronized with a scanning signal supplied to the scanning deflector 705 and to store an output signal of the detector (a signal proportional to an electron amount emitted from a sample) in addresses (x, y) on a corresponding memory. Further, the image processing unit 716 also functions as the arithmetic processing device that generates a line profile from a luminance value stored in the memory, specifies an edge position by using a threshold method, and measures a dimension between edges. The SEM performing dimension measurement based upon such line profile acquisition is referred to as a CD-SEM and is used for measuring various characteristic amounts as well as line width measurement of a semiconductor circuit. For example, surface irregularity (recessed and projected parts) referred to as line edge roughness exists on an edge of a pattern of the circuit, which causes a change in circuit performance. The CD-SEM can be used for the measurement of the LER.

FIG. 8 is a diagram illustrating an example of a measurement system including a pattern measuring apparatuse 802 that measures a pattern based upon a measurement result obtained by an SEM 801. Further, FIG. 8 illustrates the example in which the SEM 801, which is the imaging system, and an arithmetic processing device 805 (pattern measuring apparatus 802) that executes measurement processing based upon a detection signal are connected to each other via a network, however, the present invention is not limited thereto. For example, the image processing unit 716 included in the scanning electron microscope illustrated in FIG. 7 may perform calculation processing to be described later. The system illustrated in FIG. 8 includes the SEM 801, the pattern measuring apparatus 802 that performs pattern measurement, and the like based upon the obtained signal, and an input device 804 provided with a display unit.

Further, the arithmetic processing device 805 is provided with an edge detection unit 807 that detects an edge from an obtained image signal; an FFT processing unit 808 that obtains a power spectral density (PSD) by performing Fourier-analysis on a coordinate of an edge point as described later; a waveform processing unit 809 that calculates random noise and a difference between PSD curves by a method to be described later from a PSD curve generated by the FFT processing unit 808; and a measurement processing unit 810 that outputs a measurement result to the display part of the input device 804 and the memory 806 thereof by using a noise component obtained by the waveform processing unit 809, and the like.

A roughness measuring method using a pattern measuring apparatus illustrated in FIGS. 7 and 8 will be described hereinafter with reference to the drawings. As described above, in a state where random noise on an end point side (for example, right side) of a scanning line exists more than random noise on an edge of a starting point side (for example, left side) of the scanning line, when the Fourier-analysis is performed on frequency components of edge coordinates of left and right sides and the PSD curve is obtained, a shape of the PSD curve of the left-side edge and a shape of the PSD curve of the right-side edge, two of which should originally have the same shape, are different from each other.

FIG. 2 is a diagram illustrating a PSD analysis result of the LER (Line Edge Roughness) on the right-side edge. The PSD of roughness represents an intensity of a component of a specific frequency among components of various frequencies included in the roughness. Generally, as a component has a high frequency and a short wavelength, an intensity tends to be lower in the PSD, such that a spectrum tends to be attenuated as moving to the right side on a lateral axis in the drawing. Further, since the random noise has a constant intensity without depending on the wavelength, a random noise component included in the PSD curve also shows a constant value regardless of the frequency.

Calculation procedures of the random noise component which appears when LER evaluation using the above-mentioned properties is performed will hereinafter now be described. First, the random noise component of the roughness of the right edge is removed. As shown in FIG. 2, the PSD of the LER of the right edge is obtained by the Fourier-analysis on the coordinate of the right edge.

As described above, since an S/N ratio of the right edge (an edge on which a beam is irradiated later on a scanning line) is lower than that of the left edge (an edge on which the beam is irradiated earlier on the scanning line), the random noise inherent to a scanning method of the scanning electron microscope is included as well as general random noise. In other words, random noise $R_R$ on the right edge includes normal random noise $R_L$ (random noise obtained from the left edge which does not include the random noise inherent to the scanning method) and random noise $R_d (=R_R-R_L)$ inherent to the scanning method. Therefore, it is possible to obtain true roughness of the left and right edges by extracting the $R_R$ and the $R_L$ from an image and by performing predetermined calculation.

Further, as described above, since the random noise tends to be constant regardless of the wavelength (frequency) and the spectrum tends to decrease as the frequency is higher, an intensity component, the spectrum of which has decreased, can be defined as the random noise (intensity $R_R$). FIG. 3 illustrates an enlarged view of a high frequency portion of the PSD waveform of FIG. 2. An approximate straight line parallel to an x-axis is obtained by a linear approximation method, and the like from a plot of the PSD on the right edge. A value of the approximate straight line at a cutoff frequency is defined as a random noise intensity.

The cutoff frequency is set to a frequency sufficiently high enough not to affect measurement accuracy. For example, when a size on the sample corresponding to a pixel of the SEM image is 5 nm, the frequency corresponding to a wavelength of 10 nm is regarded as the cutoff frequency. The reason is that the surface irregularity (recessed and projected parts) of the edge point such as the roughness is identified by at least two neighboring edge points, such that the roughness shorter than an interval between two pixels cannot be measured in principle.

In order to efficiently obtain the random noise intensity, for example, as shown in FIG. 4, a plurality of line patterns appearing on the SEM image may be divided into short measurement regions and then be measured. A length of the measurement region is 20 nm which is a wavelength corresponding to a wave number of 0.05 in FIGS. 2 and 3. Accordingly, the Fourier-analysis is not required to calculate the whole PSDs as shown in FIG. 2, such that calculating only small number of plot points may be enough as shown in FIG. 3. Further, since a large number of the short measurement regions can be set in one SEM image, all of the obtained PSDs can be plotted in FIG. 3 and the approximate straight line can be determined from larger number of the plot points. Accordingly, it is possible to achieve the measurement with higher accuracy. As described above, it is possible to obtain an integral value of a true LER component in which the random noise component $R_R$ is removed.

Next, a difference of the PSDs obtained from the measured left and right edges is obtained. As shown in FIG. 5, the PSD of the LER of the right edge and the PSD of the LER of the left edge are plotted, and the difference therebetween is plotted to obtain the difference of the PSD.

It is confirmed that a curve showing the difference is an approximately horizontal linear shape within a predetermined range, which indicates that the difference in the LER between the left and right edges is the difference in an amount of the random noise component which becomes a constant value regardless of a wave number in the PSD. That is, when the random noise intensity of the left LER in the PSD of the LER of the left edge in FIG. 6 is set as $R_L$, an Equation 1 is described as below:

$$R_R - R_L = R_d \qquad \text{(Equation 1)}.$$

Accordingly, an Equation 2 is described as below:

$$R_L = R_R - R_d \qquad \text{(Equation 2)}.$$

$R_L$ is obtained according to the Equations 1 and 2 (difference calculation). Accordingly, it is possible to obtain the true LER component of the left edge in FIG. 6. Here, when the difference of the PSD is not the horizontal linear shape, the above-mentioned measurement is considered as not suitable and an error message is outputted.

As described above, described herein is a method for calculating the respective true LER values from the measurement results of the left and right edges. Further, the above-mentioned calculation example is only one example thereof, and, for example, $R_d$ may be first obtained based upon the calculation of a constant intensity component ($R_L$) of the left edge. The random noise $R_L$ of the left edge may be subtracted from the PSD curves of the left and right edges, after which the difference between the PSD curves of the left and right edges may be obtained. In this case, an accurate LER evaluation value of the right edge can be obtained by further subtracting $R_d$ from the PSD curve of the right edge obtained by subtracting $R_L$. Alternatively, the random noise may be individually obtained from the PSDs at the respective left and right edges without calculating the difference.

According to the exemplary embodiment described above, since the PSD curve of either one of the right edge or the left edge can be corrected after specifying the random noise inherent to the scanning method, accurate measurement can be performed when obtaining the PSDs of both of the left edge and the right edge. Further, it is advantageously possible to obtain the true roughness evaluation values of the left and right sides by performing operation different on the left and right sides.

FIG. 9 is a flowchart illustrating processing steps of the above-mentioned measurement. The image processing unit 716 or the pattern measuring apparatus 802 acquires a detection signal or an image signal obtained by performing scanning in such a manner that the scanning line of the beam intersects a pattern on a semiconductor wafer which is an object to be evaluated at step S901. Next, the CPU 717 or the edge detection unit 807 sets a measurement region of the LER at step S902. FIG. 10 is a diagram illustrating a setting example of the measurement region. As shown in FIG. 2, when the PSD curve is formed with a wave number of 0.02 as a starting point, the measurement region is set in such a manner that a line pattern having a length of 50 nm corresponding to the wave number of 0.02 is included in a y-direction. Next, the CPU 717 or the edge detection unit 807 detects edge position information of the left and right edges included in an evaluation region at step S904. The CPU 717 or the FFT processing unit 808 performs a Fourier transform on data series of each of the left and right edges. Here, frequency distribution information of the intensity is generated based upon an absolute value of a Fourier coefficient with respect to a y-direction spatial frequency f, that is, calculation of the intensity at step S906.

Meanwhile, in the processing steps S902, S904, and S906, the CPU 717 or the arithmetic processing device 805 sets the measurement region for extracting the random noise component ($R_R$) as shown in FIG. 4 and executes edge point detection at steps S903 and S905. Further, the Fourier transform is performed based upon the position information of edge point sequences, thereby extracting the random noise $R_R$ at steps S907 and S908.

Next, the CPU 717 or the waveform processing unit 809 subtracts the random noise $R_R$ from the PSD curve of the right-side edge obtained at step S906, thereby obtaining a true LER evaluation value (PSD curve) with respect to the right-side edge at step S909. Further, the PSD curve (second curve) of the LER of the left edge is subtracted from the PSD curve (first curve) of the LER of the right edge obtained at step S906, thereby calculating a random noise component $R_d$ derived from a scanning direction of the beam at step S910. As described above, when the random noise component $R_d$ is a constant value regardless of the frequency, the random noise component $R_d$ can be defined as the random noise component derived from the scanning direction. Meanwhile, when there exists an inclination, since other fluctuation factors are included and accurate measurement is expected to be difficult, a $R_d$ inclination is evaluated. Further, when the inclination is not zero or not less than a predetermined value, the CPU 717 or the measurement processing unit 810 outputs an error message at step S914.

On the other hand, when $R_d$ has no inclination and the measuring method described in the embodiments is considered to be appropriate, $R_d$ is subtracted from the PSD of the LER of the left edge, and the true LER evaluation value with respect to the left edge is obtained at step S912. The CPU 717 or the measurement processing unit 810 displays the true roughness evaluation values of the left and right edges obtained at steps S909 and S912 on the display device or stores the true roughness evaluation values thereof in a predetermined storage medium, thereby terminating the measurement processing at step S913.

Accordingly, it is possible to perform highly accurate roughness measurement without the noise component inherent to the device scanning the charged particle beam by automatically executing the above-mentioned processing steps.

Meanwhile, in the case where Line-Width Roughness (LWR) is measured, when a distance between the measured left and right edges, that is, the PSD of the line width, is plotted instead of the PSD of a measured right LER and the random noise component is subtracted from the PSD of the LER of the right edge in FIG. 2, a true LWR component can be obtained instead of a right LER component.

REFERENCE SIGNS LIST

701: electron source
702: extraction electrode
703: electron beam
704: condenser lens
705: scanning deflector
706: objective lens
707: sample chamber
708: sample stand
709: sample
710: emitted electron
711: secondary electron
712: conversion electrode
713: detector
715: A/D converter
716: image processing unit
717: CPU
718: image memory
719: storage medium
720: workstation

The invention claimed is:

1. A pattern measuring method of generating a signal waveform based upon a detection signal that is obtained by two-dimensionally scanning a charged particle beam with respect to a pattern formed on a sample, and measuring the pattern by using the signal waveform, wherein
a first curve indicating a first power spectral density with respect to an edge of one side of the pattern and a second curve indicating a second power spectral density with respect to an edge of the other side of the pattern are obtained by calculating the first power spectral density with respect to the edge of the one side of the pattern and the second power spectral density with respect to the edge of the other side of the pattern based upon a signal that is obtained when the charged particle beam is scanned in a direction intersecting the edge of the pattern;
a difference value between the first curve and the second curve is calculated; and
one of the first curve and the second curve is corrected by using the difference value.

2. The pattern measuring method according to claim 1, wherein
the charged particle beam is scanned in such a manner that the charged particle beam is irradiated on the edge of the one side earlier than the edge of the other side on a scanning line of the charged particle beam.

3. The pattern measuring method according to claim 1, wherein
a spectral intensity corresponding to a predetermined frequency is obtained from the first curve or the second curve; and
the spectral intensity corresponding to the predetermined frequency is subtracted from the first curve or the second curve.

4. The pattern measuring method according to claim 1, wherein
it is determined whether or not an inclination depending on a change in a frequency of the difference value between the first curve and the second curve is zero or equal to or less than a predetermined value.

5. A pattern measuring apparatus for measuring a pattern formed on a sample by using a signal that is obtained from a scanning region by scanning a beam on the sample, comprising:

an arithmetic processing device in which the signal is acquired; a first curve indicating a first power spectral density with respect to an edge of one side of the pattern and a second curve indicating a second power spectral density with respect to an edge of the other side of the pattern are obtained by calculating the first power spectral density with respect to the edge of the one side of the pattern and the second power spectral density with respect to the edge of the other side of the pattern based upon a signal that is obtained by scanning the beam in a direction intersecting the edge of the pattern; a difference value between the first curve and the second curve is calculated; and one of the first curve and the second curve is corrected by using the difference value.

6. The pattern measuring apparatus according to claim 5, wherein the arithmetic processing device obtains the second power spectral density based upon a signal obtained from an edge on which a charged particle beam is irradiated earlier on a scanning line of the charged particle beam; and obtains the first power spectral density based upon a signal obtained from an edge on which the charged particle beam is irradiated later on the scanning line of the charged particle beam, in one pattern.

7. The pattern measuring apparatus according to claim 5, wherein the arithmetic processing device obtains a spectral intensity corresponding to a predetermined frequency from the first curve or the second curve; and the spectral intensity corresponding to the predetermined frequency is subtracted from the first curve or the second curve.

8. The pattern measuring apparatus according to claim 5, wherein the arithmetic processing device determines whether or not an inclination depending on a change in a frequency of the difference value between the first curve and the second curve is zero or equal to or less than a predetermined value.

* * * * *